United States Patent [19]
Kanai et al.

[11] Patent Number: 5,792,376
[45] Date of Patent: Aug. 11, 1998

[54] PLASMA PROCESSING APPARATUS AND PLASMA PROCESSING METHOD

[75] Inventors: Hideki Kanai, Yokohama; Ikuo Yoneda, Kawasaki; Masamitsu Itoh, Yokohama, all of Japan

[73] Assignee: Kabushiki Kaisha Toshiba, Kawasaki, Japan

[21] Appl. No.: 580,824

[22] Filed: Dec. 29, 1995

[30] Foreign Application Priority Data

Jan. 6, 1995 [JP] Japan ................................. 7-000622
Mar. 15, 1995 [JP] Japan ................................. 7-055648

[51] Int. Cl.$^6$ ................................. H05H 1/00
[52] U.S. Cl. ................. 216/71; 438/729; 156/345; 118/723 E
[58] Field of Search .................. 156/345, 643.1; 204/298.34, 298.06; 118/723 E; 216/67, 71; 438/715, 716, 729

[56] References Cited

U.S. PATENT DOCUMENTS 4,786,359  11/1988  Stark et al. .................. 156/643.1
5,494,523   2/1996  Steger et al. .............. 204/298.15 X

FOREIGN PATENT DOCUMENTS 60-239025  11/1985  Japan .
62-47131    2/1987  Japan .
1-175738    7/1989  Japan .
2-155230    6/1990  Japan .
4-99318     3/1992  Japan .

*Primary Examiner*—Thi Dang
*Attorney, Agent, or Firm*—Oblon, Spivak, McClelland, Maier & Neustadt, P.C.

[57] ABSTRACT

A plasma processing apparatus includes a first electrode which is substantially flat and has a substrate mounting region mounted with a substrate to be treated, a chamber for containing the first electrode, gas introducing means for introducing a predetermined gas into the chamber, gas exhausting means for exhausting the gas from the chamber, a second electrode constituted of one of a metal portion of the chamber and a metal plate provided inside the chamber, power supply means for supplying high-frequency power between the first electrode and the second electrode, and an insulative cover for covering a surface of the first electrode other than the substrate mounting region. The substrate mounting region is formed as a convex portion on the first electrode, and an outside shape thereof is smaller than that of the substrate. The substrate is mounted on the substrate mounting region so as to completely cover the substrate mounting region.

8 Claims, 8 Drawing Sheets

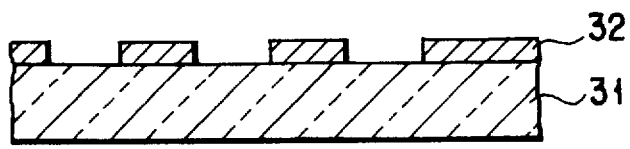
F I G. 3A
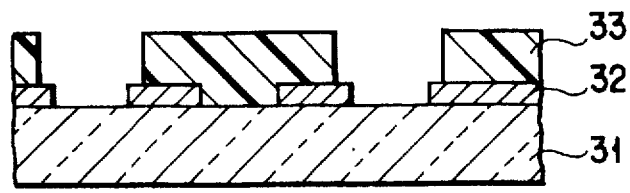
F I G. 3B
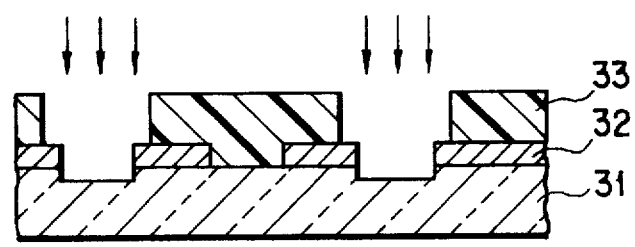
F I G. 3C
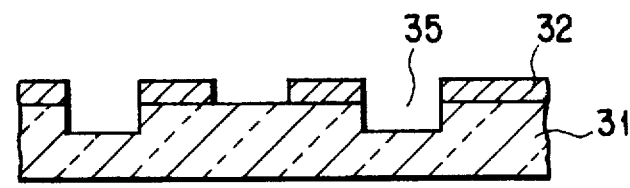
F I G. 3D
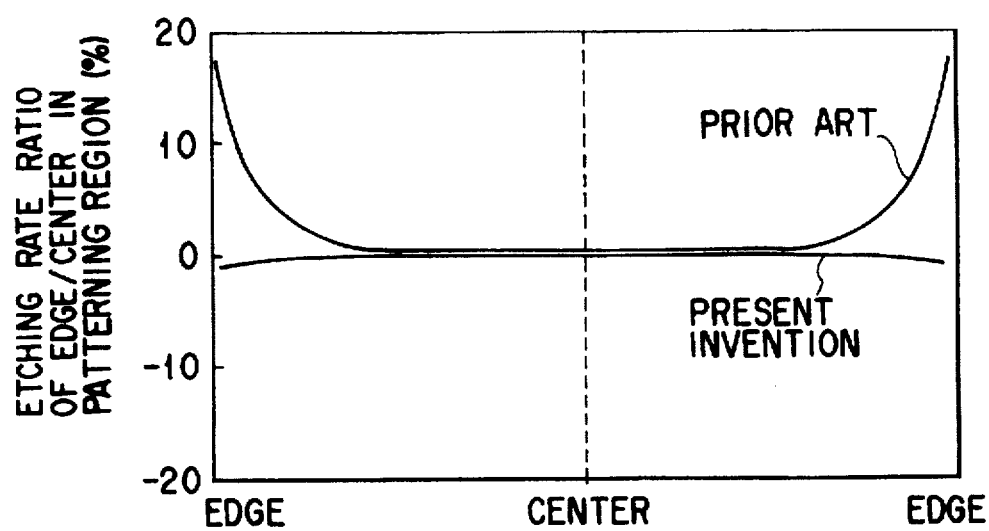
F I G. 4

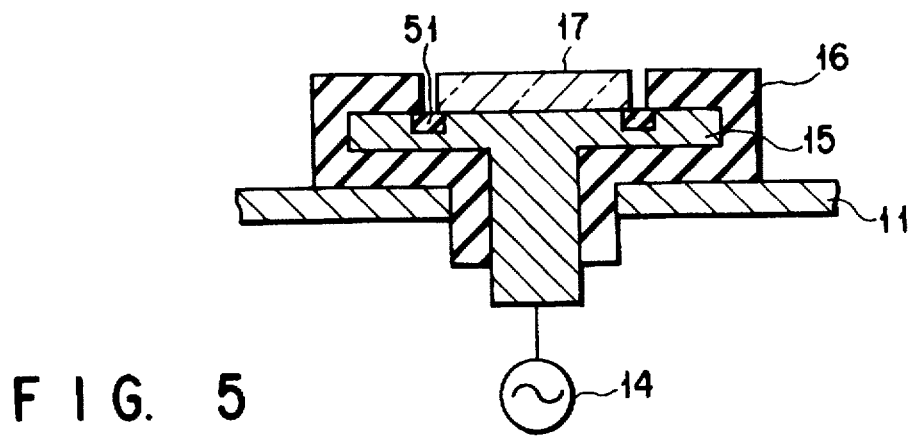
F I G. 5
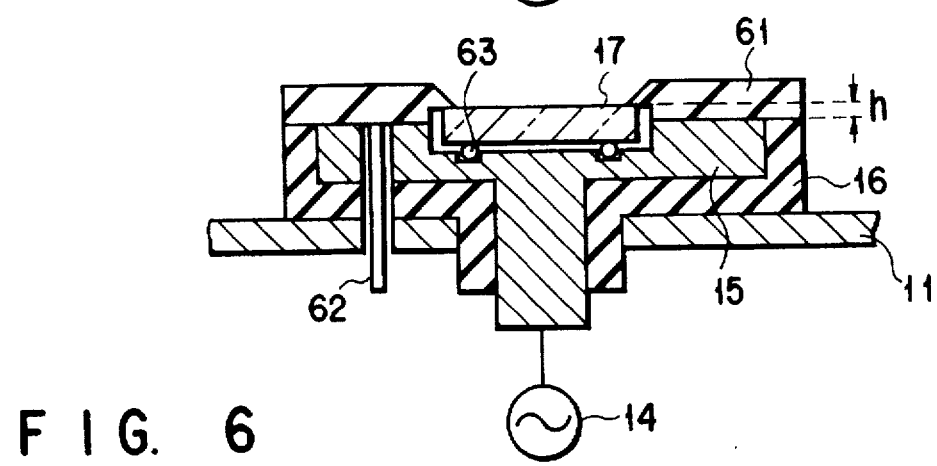
F I G. 6
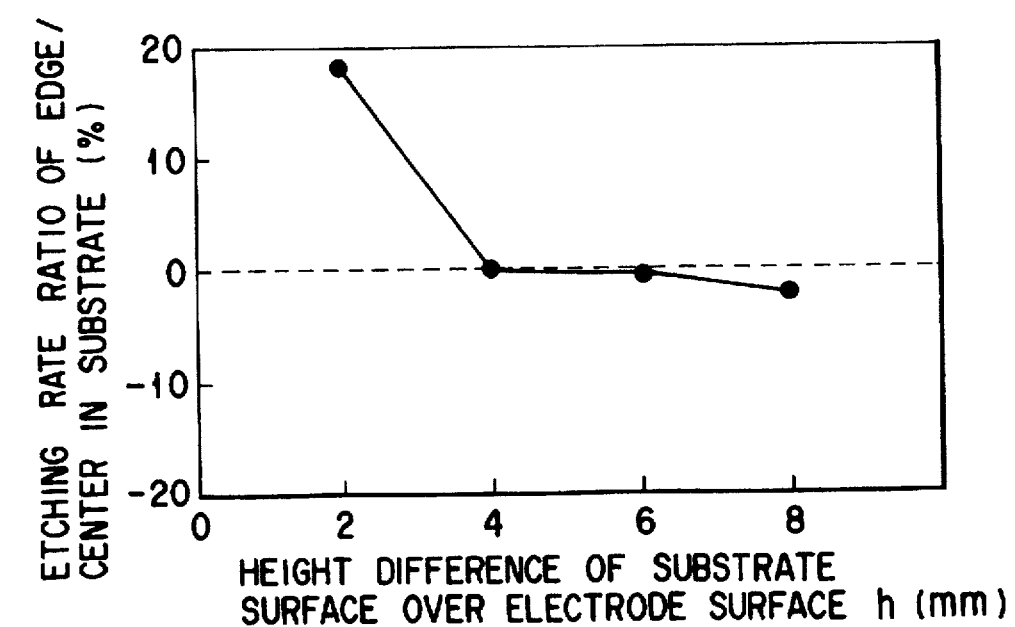
F I G. 7

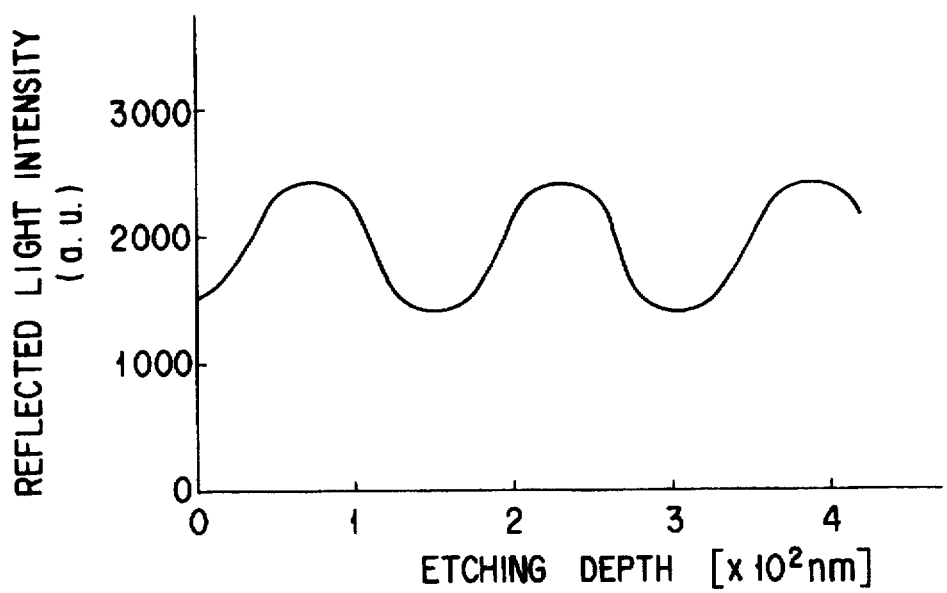
F I G. 10
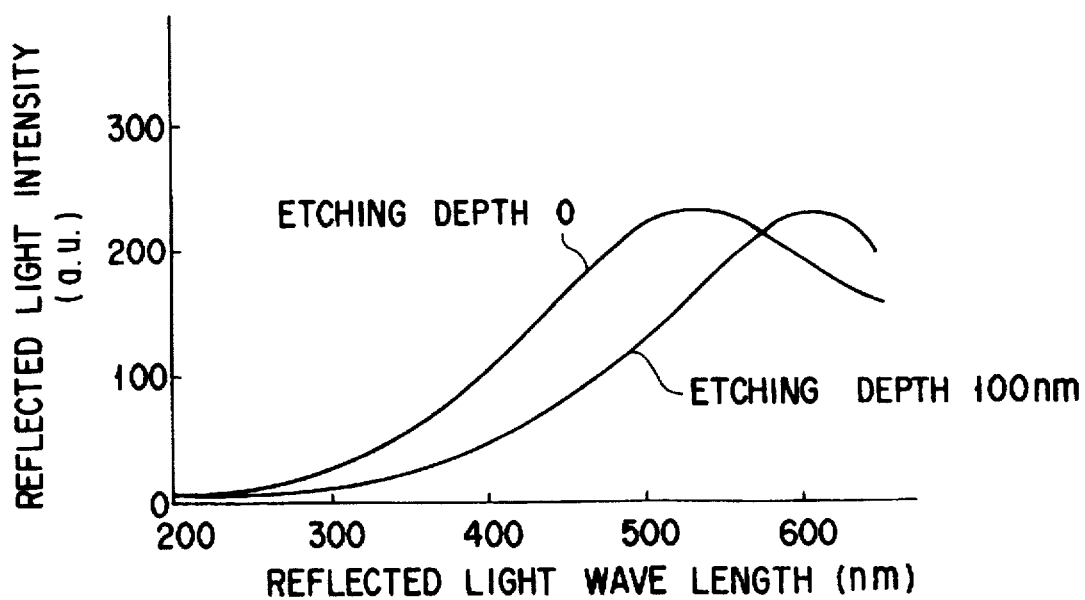
F I G. 11

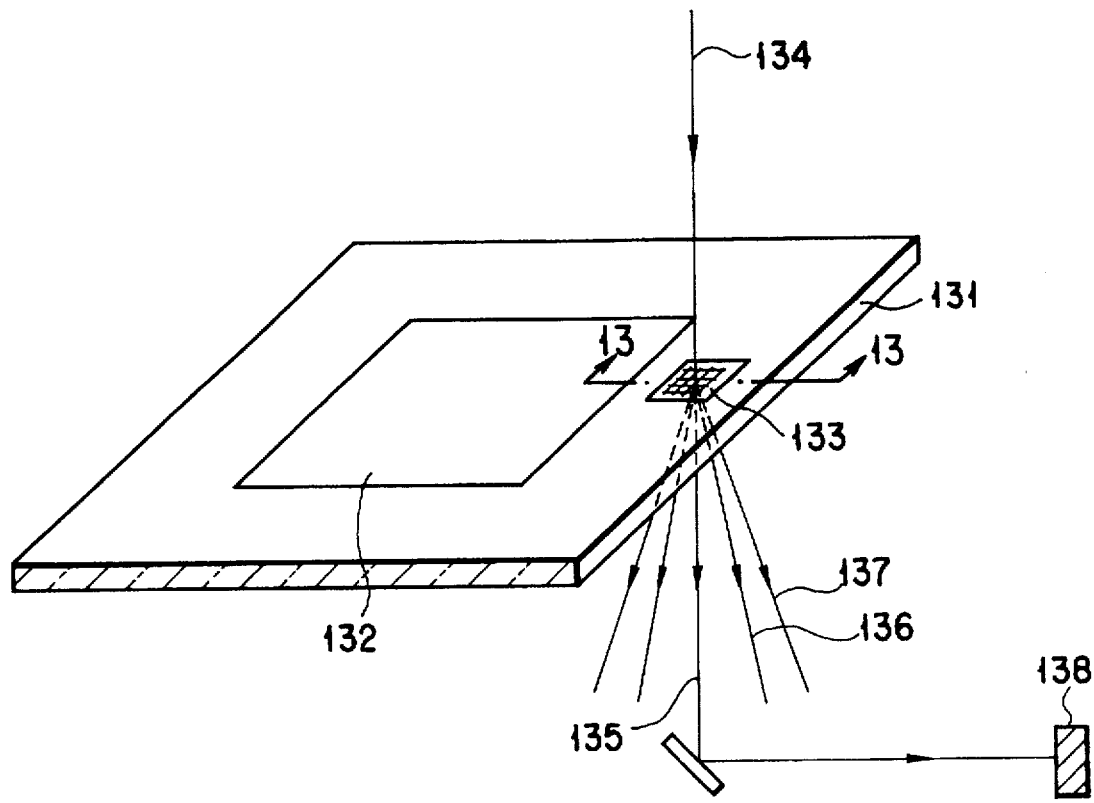
F I G. 12
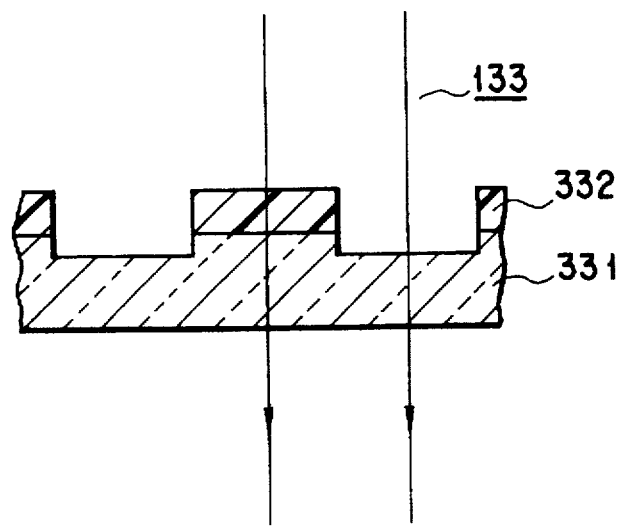
F I G. 13

PLASMA PROCESSING APPARATUS AND PLASMA PROCESSING METHOD

BACKGROUND OF THE INVENTION

1. Field of the Invention

The present invention relates to a plasma processing apparatus and a plasma processing method used for etching and film deposition in manufacturing a semiconductor integrated circuit and, more particularly, to a plasma processing apparatus and a plasma processing method suitable for manufacturing a photomask and a liquid crystal display.

2. Description of the Related Art

High degree of integration of elements and wiring for constituting a circuit and fine processing of patterns have recently been developed in manufacturing a semiconductor integrated circuit. In photolithography, a phase shifting mask is employed as one method for improving in fine processing of patterns.

A method of manufacturing an alternating phase shifting mask is disclosed in, for example, Jpn. Pat. Appln. KOKAI Publication No. 2-211450. According to this method, an opaque film of metal or metal oxide is formed as a first pattern on a transparent substrate, a resist film is applied to the first pattern, a second pattern for forming a phase shifting region is transferred to the resist film using, for example, an electron beam lithography system, and the transparent substrate is subjected to dry etching to form a phase shifter.

The degree of integration of devices is improving more quickly than the fine processing of patterns, and the area of a chip is increasing. The technique of arranging a plurality of chip patterns of a device in an exposing mask substrate for the purpose of improving in process throughput, attracts attention.

The pattern area of the exposing mask substrate is increased, as is the size of the mask itself. In order to maintain the precision of patterning when a pattern is formed on the mask substrate, it is necessary to sufficiently keep the mechanical strength and rigidity which are equivalent to those of a small-sized mask substrate. To meet this necessity, the mechanical strength is compensated by thickening the substrate (whose material is, e.g., quartz).

In the dry etching process, a method of applying high frequency of, e.g., 13.56 MHz between parallel plate electrodes using $CF_4+O_2$ gas by an RIE (Reactive Ion Etching) apparatus, is adopted. The electrodes mounted with a mask substrate used in this method, are as follows.

The first type of electrode is formed larger than the mask substrate and its sides and back are covered with insulative covers. In the second type of electrode, an outside region of a substrate mounting region on the surface of the electrode is covered with an insulative cover in addition to the covered portions of the first type of electrode. In the third type of electrode, in order to control the temperature of the substrate during the etching, the substrate is fixed onto the surface of the electrode through an O-shaped ring and a cooling gas is introduced under the substrate to cool the substrate in good condition. Since the substrate is pressed on the surface of the electrode by a hook made of insulative materials, the cooling gas introduced between the substrate and electrode is prevented from flowing into an etching chamber. The hook covers the surface of the electrode other than the substrate mounting region.

The above electrodes, however, have the following drawbacks. As the substrate increases in thickness to keep its rigidity, it is hard to transmit a high frequency since it is an insulator having a high impedance. If the substrate/electrode system includes a portion through which the high frequency is easy to flow during the etching, an electric field is concentrated upon that portion.

In the first type of electrode, an electric field is concentrated upon that surface portion of the electrode which is exposed when the substrate is mounted thereon. Due to this concentration, the energy generated when active ions of reactive gas plasma enter the substrate is larger in the edge portion of the substrate than in the central portion thereof, thereby increasing an etching rate in the edge portion.

In the second type of electrode, a gap is caused between the substrate and the insulative cover formed over the electrode surface, and a high frequency escapes out of the gap and an electric field is concentrated thereon. Like the first type of electrode, the etching rate in the edge portion of the substrate is higher than that in the central portion thereof.

In the third type of electrode, the hook is usually constituted of insulative materials, as described above. Since the surface level of the hook is higher than that of the substrate, an electric field is distorted above the edge portion of the substrate, and the etching rate in this portion becomes lower than that in the central portion thereof. If the hook is constituted of metallic materials, the etching rate in the edge portion of the substrate is higher than that in the central portion thereof, as in the first type of electrode.

When a phase shifting mask is formed by etching, the etching rate is affected by phase difference and concerned with pattern resolution, so that it is very important to maintain the constant and/or uniform etching rate. When a liquid crystal display device is manufactured, the etching for forming a wiring layer has to be performed uniformly. Since, however, there occurs a difference in intensity of electric field between the central and edge portions in the conventional electrode, it is difficult to secure the uniformity of etching.

As described above, it is remarkably important to sufficiently maintain the uniform etching when a phase shifting mask or a liquid crystal display device is manufactured, but in the conventional electrode, a difference in intensity of electric field between the central and edge portions thereof prevents the uniform etching. This problem is true of not only the etching but also film deposition such as plasma CVD.

The exposure performance of a phase shifting mask is very relevant to the phase etch depth of a shifter. For example, when an excimer stepper (wavelength=248 nm) and an alternating phase shifting mask are applied to a 0.18 µm line/space pattern, the phase etch depth of a shifter needs to be adjusted to a desired value. The desired value is within ±3% of an amount by which the phase is shifted by 180° in comparison with a portion wherein the shifter is not formed. The shifting angle can be set at 120°, 90° and the like according to the arrangement of patterns.

Since, however, no etching stop layer is formed when a quartz substrate is etched to a predetermined depth, it is very difficult to obtain the depth. When a shifter is placed on the substrate and its material is $SiO_2$, the etching selectivity of the quartz substrate and $SiO_2$ is insufficient and the thickness of the shifter is difficult to set at a desired value.

In the above-described conventional method of manufacturing a phase shifting mask, it is necessary to etch a substrate or a shifter to a predetermined depth but difficult to control the depth with good controllability. The foregoing drawbacks can be applied to various types of processes necessary for etching a substrate to a predetermined depth as well as manufacturing of phase shifting masks.

SUMMARY OF THE INVENTION

An object of the present invention is to provide a plasma processing apparatus and a plasma processing method capable of making an electric field in central and edge portions of a substrate to be treated substantially equal to each other thereby to achieve uniform etching and uniform film deposition.

To attain the above object, according to a first aspect of the present invention, there is provided a plasma processing apparatus comprising:

a first electrode which is substantially flat and has a substrate mounting region mounted with a substrate to be treated;

a chamber for containing the first electrode;

gas introducing means for introducing a predetermined gas into the chamber;

gas exhausting means for exhausting the gas from the chamber;

a second electrode constituted of one of a metal portion of the chamber and a metal plate provided inside the chamber;

power supply means for supplying high-frequency power between the first electrode and the second electrode; and an insulative cover for covering a surface of the first electrode other than the substrate mounting region, wherein the substrate mounting region is formed as a convex portion on the first electrode and an outside shape thereof is smaller than that of the substrate, and the substrate is mounted on the substrate mounting region so as to completely cover the substrate mounting region.

In order to uniform the electric field on the insulative cover, it is desirable that the surface of the insulative cover be substantially level with that of the substrate when the substrate is mounted on the substrate mounting region. It is also desirable that the impedance of the insulative cover to a high frequency be substantially the same as that of the substrate.

According to the present invention, the area of that part of the first electrode, to which a high frequency is applied and which is not covered with the insulative cover, is smaller than that of the surface of the substrate. When the substrate is mounted on the substrate mounting region of the first electrode when it is processed, the first electrode is completely covered with the substrate and insulative cover.

In the conventional plasma processing apparatus aforementioned, electric field is concentrated on the periphery of the substrate or electric fields are weakened thereon. For example, if there is a gap between the substrate and insulative cover and an electrode is exposed therefrom, a high frequency flows through the gap, resulting in concentration of electric fields in the vicinity of the gap.

The electric fields are formed above the substrate by the high frequency flowing through the substrate. Though the substrate is an insulator, if the electrode is exposed, the high frequency easily flows through the substrate and is concentrated thereon. In other words, the high frequency is concentrated on the gap between the substrate and insulative cover and so is the electric field accordingly. The energy of ions emitting from plasma to the substrate in the edge portion of the substrate is increased more than that in the central portion thereof, and the etching rate in the edge portion is higher than that in the central portion.

In contrast, according to the present invention, since the electrode is not exposed from a gap to make a high frequency hard to transmit the gap, the concentration of electric field, as in the prior art, can be avoided. Consequently, the etching rate and film deposition rate can be uniformed in the edge and central portions of the substrate.

It is desirable that the electrode be shorter than the substrate and a difference between the side of the electrode and that of the substrate be 2 mm to 10 mm. If the difference is less than 2 mm, a high frequency transmits the insulative cover, flows through the gap, and affects the electric fields. If the difference is more than 10 mm, there is no electrode under the edge portion of the substrate, so that a high frequency, which transmits the substrate to form an electric field on the surface thereof, is decreased and the etching rate is lowered.

According to a second aspect of the present invention, there is provided a plasma processing apparatus comprising:

a first electrode which is substantially flat and has a substrate mounting region mounted with a substrate to be treated;

a chamber for containing the first electrode;

gas introducing means for introducing a predetermined gas into the chamber;

gas exhausting means for exhausting the gas from the chamber;

a second electrode constituted of one of a metal portion of the chamber and a metal plate provided inside the chamber;

power supply means for supplying high-frequency power between the first electrode and the second electrode; and an insulative cover whose inner periphery surrounds the substrate, for covering a surface of the first electrode other than the substrate mounting region, wherein the substrate mounting region is an island region surrounded by a groove portion and an outside shape of the island region is smaller than that of the substrate; the groove portion extends under the insulative cover and is filled with an insulator such that a surface of the insulator is lower than that of the substrate mounting region; and the substrate is mounted on the substrate mounting region so as to completely cover the substrate mounting region.

In order to uniform the electric field on the insulative cover, it is desirable that the surface of the insulative cover be substantially level with that of the substrate when the substrate is mounted on the substrate mounting region.

It is desirable that the impedance of the insulative cover to a high frequency be substantially the same as that of the substrate to the high frequency.

It is desirable that the outward shape of the substrate mounting region be 2 mm to 10 mm smaller than that of the substrate.

It is desirable that the groove portion be formed such that the outer periphery thereof is located 2 mm or more outward from the inner periphery of the insulative cover.

According to the second aspect of the present invention, since the insulator is buried into the gap between the substrate and insulative cover, a high frequency can be prevented from flowing through the gap and, as in the first aspect of the present invention, the uniform distribution of electric field can be obtained, resulting in improvement in constant etching rate and film deposition rate.

A plasma processing method using the plasma processing apparatus of the first and second aspects, comprises the steps of:

preparing a plasma processing apparatus comprising a first electrode which is substantially flat and has a substrate mounting region mounted with a substrate to be treated, a chamber for containing the first electrode, gas introducing means for introducing a predetermined gas into the chamber, gas exhausting means for exhausting the gas from the chamber, a second electrode constituted of one of a metal portion of the chamber and a metal plate provided inside the chamber, power supply means for supplying high-frequency power between the first electrode and the second electrode to generate plasma in the chamber and an insulating layer for covering the surface of the first electrode other than the substrate mounting region;

mounting the substrate on the substrate mounting region of the first electrode in such a manner that the substrate completely covers the substrate mounting region;

introducing the gas into the chamber; and supplying the high-frequency power between the first electrode and the second electrode.

According to a third aspect of the present invention, there is provided a plasma processing apparatus comprising:

a first electrode which is substantially flat and has a substrate mounting region mounted with a substrate to be treated;

a chamber for containing the first electrode;

gas introducing means for introducing a predetermined gas into the chamber;

gas exhausting means for exhausting the gas from the chamber;

a second electrode constituted of one of a metal portion of the chamber and a metal plate provided inside the chamber;

power supply means for supplying high-frequency power between the first electrode and the second electrode; and an insulative cover for covering at least a surface of the first electrode other than the substrate mounting region, wherein the substrate mounting region is formed as a concave portion which is larger than an outside shape of the substrate.

It is desirable that a thickness of the insulative cover be substantially equal to that of the substrate, and an impedance of the insulative cover to a high frequency be substantially equal to that of the substrate to the high frequency.

It is desirable that the surface of the substrate mounted on the substrate mounting region is 4 mm to 6 mm higher than the part of the surface of the first electrode other than the substrate mounting region.

According to the third aspect of the present invention, a cooling gas such as helium is introduced from under the substrate in order to control the temperature of the substrate during the process. A gap between the substrate and electrode is sealed with an O-ring or the like to prevent the cooling gas from leaking into the chamber ring the process, and a hook fixing the substrate onto the first electrode is provided on the electrode.

The hook is constituted of insulative materials which are hard to transmit a high frequency. If the surface level of the hook is higher than that of the substrate, the electric field intensity is decreased in the edge portion of the substrate, and the etching rate in the edge portion of the substrate is lower than that in the central portion thereof.

In contrast, according to the present invention, the distribution of electric field is controlled by making the impedances of the substrate and hook to the high frequency substantially equal to each other. In other words, an electrode is provided outside the substrate by forming a region for the outside electrode higher than the substrate mounting region of the first electrode, thereby controlling the high frequency transmitting the hook and substrate. As the outside electrode increases in surface level or the impedance of the insulative materials to the high frequency decreases, the field intensity in the edge portion of the substrate becomes higher than that in the central portion thereof. Consequently, by optimizing the surface level of the electrode, the difference in field intensity between the edge and central portions of the substrate can be diminished, and the etching rate and film deposition rate can be improved in uniformity.

A plasma processing method using the plasma processing apparatus of the third aspect, comprises the steps of:

preparing a plasma processing apparatus comprising a first electrode which is substantially flat and has a substrate mounting region mounted with a substrate to be treated, a chamber for containing the first electrode, gas introducing means for introducing a predetermined gas into the chamber, gas exhausting means for exhausting the gas from the chamber, a second electrode provided in the chamber, power supply means for supplying high-frequency power between the first electrode and the second electrode and an insulative cover for covering at least a surface of the first electrode other than the substrate mounting region;

mounting the substrate on the substrate mounting region of the first electrode and then completely covering an exposed portion of the first electrode with the insulative cover;

introducing the gas into the chamber; and supplying the high-frequency power between the first electrode and the second electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A to 3D are cross-sectional views of a mask substrate in steps of manufacturing an alternating phase shifting mask;

FIG. 4 is a diagram showing the relationship between position in substrate and etching rate with respect to the apparatus of the first embodiment and the prior art;

FIG. 5 is a cross-sectional view showing the structure of an electrode of a plasma etching apparatus according to a second embodiment of the present invention;

FIG. 6 is a cross-sectional view showing the structure of an electrode of a plasma etching apparatus according to a third embodiment of the present invention;

FIG. 7 is a diagram showing the relationship between an etching rate and a difference in height between substrate and electrode surfaces in the apparatus shown in FIG. 6;

FIG. 10 is a graph showing the dependence of reflected light intensity upon an etching depth when the light is monochromatic light;

FIG. 11 is a graph showing the dependence of reflected light intensity upon an etching depth when the light is white light;

FIGS. 12 and 13 are a perspective view of an optical system and a cross-sectional view of a mask substrate, respectively, which show the principle of a method for monitoring an etching depth using light transmitted by a diffraction grating pattern;

DETAILED DESCRIPTION OF THE PREFERRED EMBODIMENTS

Embodiments of the present invention will now be described with reference to the accompanying drawings.

(First Embodiment)

Figure 1:
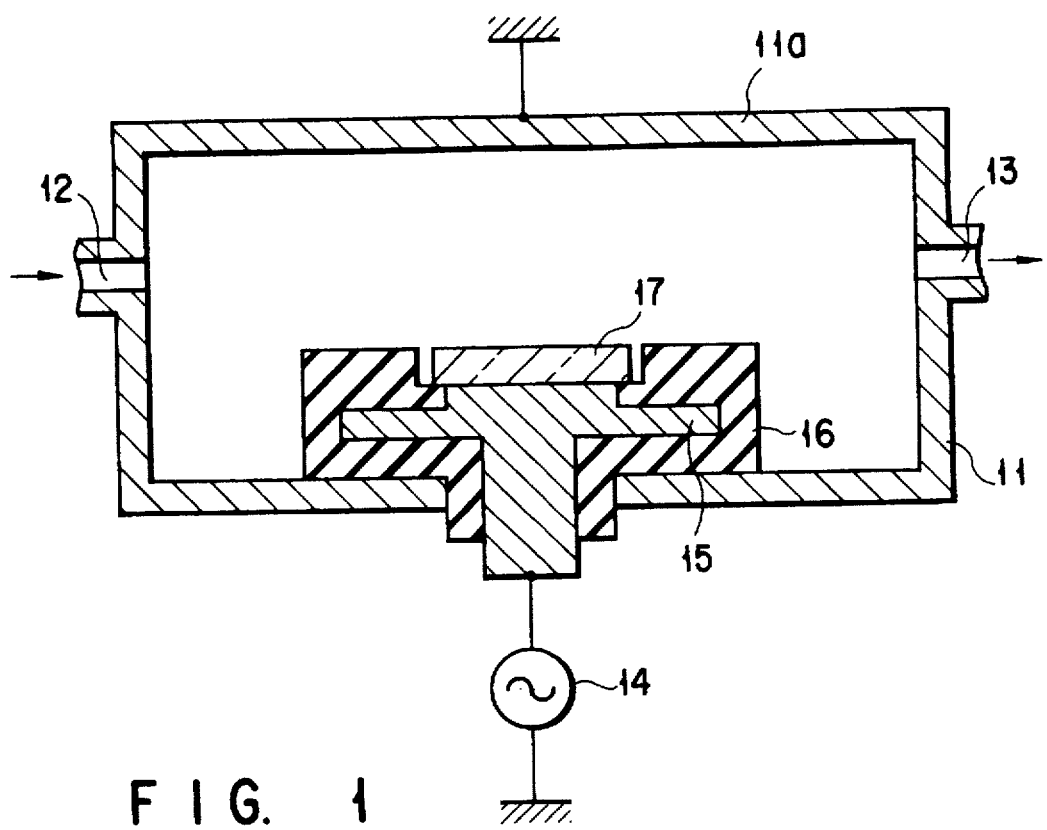
FIG. 1 is a cross-sectional view schematically showing the constitution of a plasma etching apparatus according to a first embodiment of the present invention.

FIG. 1 is a cross-sectional view schematically showing the constitution of a plasma etching apparatus according to a first embodiment of the present invention. In FIG. 1, reference numeral 11 indicates an airtight chamber constituted of aluminum, stainless steel, or the like. Gas is introduced into the chamber 11 through an inlet 12, and gas of the chamber is exhausted through an outlet 13.

The chamber 11 includes a first electrode 15 mounted with a substrate 17 to be treated (a typical substrate is a square one whose side is 6 inches and whose thickness is 0.25 inch). A high frequency supply 14 applies high frequency to the first electrode 15, and the chamber 11 is grounded. An upper portion 11a of the chamber 11, which faces the first electrode 15, serves as a second electrode, and the first and second electrodes constitute a parallel plate electrode.

The structure of the first electrode 15 will be described more specifically. The electrode 15 has a convex portion on its surface. The convex portion is obtained by removing a surface portion other than a central surface portion by several millimeters. The substrate 17 is mounted on the convex portion which is smaller than the substrate. The convex portion is formed in such a way that its side is located 3 mm inward from that of the substrate 17. The region of the electrode 15 other than the convex portion is covered with an insulative cover 16. This cover 16 is made of alumina and its thickness is 5 mm which is somewhat smaller than that of the substrate. The undersurface of the electrode 15 is provided with a leading portion for leading the electrode 15 outside the chamber.

Figure 2:
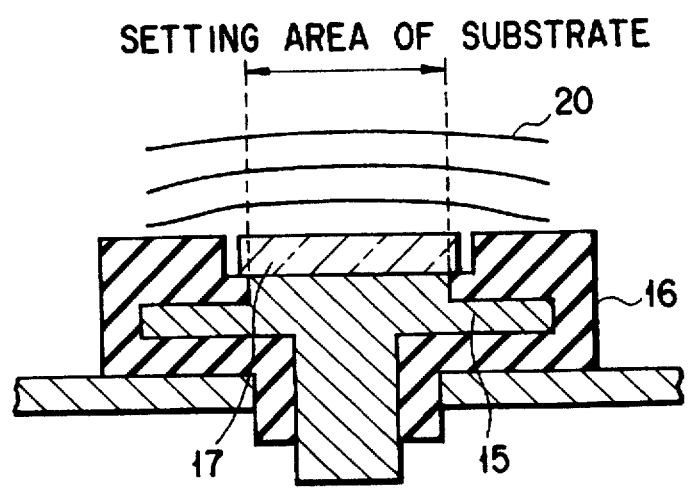
FIG. 2 is a cross-sectional view of the structure of an electrode used in the apparatus shown in FIG. 1.

With the above structure, when the substrate 17 is mounted on the convex portion, the upper surface of the electrode 15 is not exposed toward the second electrode 11a. Thus, electric fields are prevented from being concentrated upon a gap between the insulative cover 16 and substrate 17 and, as shown in FIG. 2, an uniform distribution of electric field can be formed on the substrate. In FIG. 2, reference number 20 denotes the equipotential surface of the electric field. It is desirable that the impedance of the insulative cover to a high frequency be almost equal to that of the substrate to the high frequency. In this case, as shown in FIG. 2, the electric field is slightly decreased in a region outside the substrate 17, but the uniform distribution thereof can be obtained at least on the surface of the substrate. Consequently, the substrate 17 can be etched uniformly using the apparatus of the present invention.

In the first embodiment, the substrate 17 is mounted on that convex portion of the electrode 15 which is slightly smaller than the substrate 17, as described above. The entire electrode 15 can be made somewhat smaller than the substrate 17; however, if the electrode is formed as shown in FIG. 1, the electrode also exists outside the substrate mounting region and thus the electric field can be prevented from suddenly changing in the vicinity of the substrate. The apparatus of the first embodiment is therefore effective in uniforming the distribution of the electric field.

A method of manufacturing an alternating phase shifting mask using the apparatus of the first embodiment, will now be described, with reference to FIGS. 3A to 3D. In this method, a square quartz substrate whose side is 6 in. and whose thickness is 0.25 inch, is employed.

As illustrated in FIG. 3A, an opaque film pattern 32 of chromium (Cr) is formed on the quartz substrate 31. As shown in FIG. 3B, the entire surface of the pattern 32 is coated with a resist film 33, an opening is exposed by an electron beam lithography system and then developed, thereby forming an opening in the resist film. As shown in FIG. 3C, the exposed portion of the surface of the quartz surface is etched using the opaque film 32 and resist 33. Finally, as illustrated in FIG. 3D, the resist film 33 is stripped from the substrate, thus completing an alternating phase shifting mask having a shifter section 35 for each opening of the resist.

The etching apparatus of the first embodiment is used for etching the quartz substrate ($SiO_2$). The etching is conducted using $CF_4$ gas under a pressure of 40 mTorr at a high frequency power of 0.75 W/cm$^2$ (frequency: 13.56 MHz). FIG. 4 shows the relationship between etching rate and position in substrate for each of the present invention and prior art. In this case, the edge portion does not mean the exact edge of the substrate, but means 120 mm×120 mm square line within which a mask pattern is formed. In the prior art, the etching rate in the edge portions of the substrate is about 20% higher than that in the central portion thereof. This difference in etching rate corresponds to a phase difference of 36 degrees in light. In the present invention, the etching rate is almost constant and varies only within a range of ±3%. This difference corresponds to a phase difference of 5 degrees.

In the alternating phase shifting mask fabricated by a prior art etching apparatus, if the phase difference on the central portion of the mask is adjusted to 180 degrees, that on the edge portions thereof is 216 degrees. When the mask is exposed using an i-line stepper (wavelength=365 nm, NA=0.57, σ=0.4), the depth of focus is 1.2 μm or more in the central portion of a 0.25 μm line/space pattern, whereas that is only 0.2 μm in the edge portions thereof.

In contrast, when the alternating phase shifting mask produced by the first embodiment of the present invention is exposed by an i-line stepper (wavelength=365 μm, NA=0.57, σ=0.4), the depth of focus of 1.2 μm or more can be achieved on the entire 0.25 μm line/space pattern which is formed within 120 by 120 millimeters square on the substrate. In this case, the etching depth corresponding to the phase difference 180° is 385 nm.

(Second Embodiment)

FIG. 5 is a cross-sectional view showing the structure of an electrode of a plasma etching apparatus according to a second embodiment of the present invention. In FIG. 5, the same structural elements as those in FIG. 1 are denoted by the same reference numerals and their detailed description is omitted.

According to the second embodiment, the surface of an electrode 15 is considerably larger than that of a substrate 17, a groove is formed in a gap of an exposed electrode portion between the substrate 17 and insulative cover 16, and an insulative material 51 is buried into the groove. More specifically, a ring-shaped recess (groove) is formed in the surface of the electrode 15 and its width is somewhat larger than that of the gap between the cover 16 and substrate 17, and the insulative material 51 is buried into the recess. It is desirable that a portion of the recess lying under the substrate 17 range from 2 mm to 10 mm in width and the other portion thereof lying under the cover 16 be 2 mm or more in width. The insulative material 51 can be the same as that of the insulative cover 16 or replaced with another one.

In the second embodiment, too, it is advisable to make the thickness of the insulative cover and the impedance thereof to a high frequency substantially equal to those of the substrate.

With the electrode structure described above, since a region having high electric field intensity is not formed, the electric field intensity can be maintained uniformly in both the central and edge portions of the substrate 17. The same advantage as that of the first embodiment can thus be obtained.

(Third Embodiment)

FIG. 6 is a cross-sectional view showing the structure of an electrode of a plasma etching apparatus according to a third embodiment of the present invention. In FIG. 6, the same structural elements as those in FIG. 1 are indicated by the same reference numerals and their detailed description is omitted.

In order to control the temperature of a substrate 17 during the process, cooling gas such as helium is introduced between the undersurface of the substrate 17 and electrode 15. An O-ring 63 is inserted between the substrate 17 and electrode 15, and a hook 61 for pressing the substrate 17 on the electrode 15 is provided on the electrode 15. The undersurface of the substrate 17 is therefore sealed to prevent the cooling gas from leaking into an etching chamber during the process.

Though not shown in FIG. 6, a refrigerant path is formed inside the electrode 15, and the electrode 15 is cooled by a refrigerant flowing through the path. The electrode 15 has a through hole for causing the cooling gas to flow toward the undersurface of the substrate 17. Reference numeral 62 in FIG. 6 represents an operation rod for releasing the substrate 17 pressed by the hook 61.

The hook 61 is constituted of insulative materials which are hard to transmit a high frequency. If the surface level of the hook 61 is higher than that of the substrate 17, the electric field is distributed as the third type electrode of the prior art aforementioned. If the sides of the electrode 15 are completely surrounded by the hook 61, the etching rate in the edge portion of the substrate 17 is lower than that in the central portion thereof. In the third embodiment, therefore, the electrode outside the substrate 17 is thickened and the high frequency flowing through the substrate 17 and hook 61 is controlled to make the etching rate constant. For this reason, a substrate mounting region of the electrode 15 is formed concavely.

FIG. 7 is a graph showing variations in etching rate due to a difference h in surface level between the substrate and electrode. The ordinate of the graph indicates the ratio of etching rate in the edge portion of substrate 17 to that in the central portion thereof. In this case, the hook is formed of alumina and a portion thereof contacting the substrate 17 is constituted of organic materials having low hardness. A magnetron RIE system is employed to remove an $SiO_2$ film on the substrate by etching. This etching is performed using $CF_4$ gas under a pressure of 40 mTorr.

When the difference h in surface level is about 6 mm to 8 mm, the impedance of the hook 61 to a high frequency is greater than that of the substrate 17 thereto, and the surface level of the hook 61 is higher than that of the substrate 17. In this case, the etching rate in the edge portion of the substrate is lower than that in the central portion thereof. When the difference h is 2 mm, the impedance of the hook 61 to the high frequency is smaller than that of the substrate 17 thereto and thus the potential on the edge portion of the substrate 17 becomes higher than that on the central portion thereof. As a result, the etching rate on the edge portion is higher than that on the central portion.

If the difference h is 4 mm to 6 mm, especially 4 mm, the etching rates in the edge and central portions are equalized to each other by offsetting the influence of electric fields distorted by setting the surface level of the hook higher than that of the substrate and the influence caused by the fact that the impedance of the hook 61 to the high frequency is smaller than that of the substrate. It is thus desirable that the difference h be about 4 mm to 6 mm when the hook 61 is provided; however, the desirable difference depends upon the material and thickness of the hook 61 and the thickness of the substrate.

In the third embodiment, too, it is advisable to make both the thickness of the insulative cover and the impedance thereof to a high frequency substantially equal to those of the substrate.

The electrode 15 is not always provided in a lower portion of the airtight chamber 11, but can be done in an upper portion thereof and the substrate 17 can be fixed on the electrode 15 with its processing surface downward. This constitution prevents dust attached to the inner wall of the chamber 11 or deposit lying therein from being separated from the chamber and dropping onto the processing surface of the substrate 17. In this case, it is desirable that the hook 61 be constituted of insulative materials resistant to etching; however, it can be constituted of ceramic such as SiC and AlN and resin resistant to high temperature in addition to alumina.

By producing an alternating phase shifting mask using the apparatus of the third embodiment and exposing it using an i-line stepper (wavelength=365 nm, NA=0.57, σ=0.4), the depth of focus of 1.2 μm can be achieved on a 0.25 μm line/space pattern of the substrate.

The present invention is not limited to the first to third embodiments described above. Although the embodiments are directed to a plasma etching apparatus, the present invention can be applied not only to a plasma generation system such as a magnetron type RIE apparatus and a process apparatus using helicon plasma but also to the process apparatus in general for applying a high-frequency voltage to the electrode provided under the substrate.

The above embodiments are directed to the formation of an alternating phase shifting mask. However, the present invention can be applied to the formation of a photomask such as etching of an opaque film of a commonly-used mask, that of a halftone film of a halftone phase shifting mask (attenuated phase shifting mask), and the deposition of these films. It can also be applied to etching of metal wiring of, e.g., a substrate of a liquid crystal display using an insulator such as glass, fluorite and alumina and, in this case, the constant etching rate can be achieved.

The present invention is not limited to the etching of a substrate to be treated, but can be applied to the formation of a film by plasma CVD or the like. In the film deposition, the foregoing constitution (shown in FIGS. 1, 5 and 6) need not be changed, but the film has only to be deposited by a well-known technique, using a gas introduced into the chamber as a source material. The present invention can also be applied to surface treating and the like. Various changes and modifications can be made if they do not depart from the scope of the subject matter of the present invention.

As described above in detail, according to the present invention, the electrode mounted with a to-be-treated substrate is improved in structure to equalize the electric field intensities in the edge and central portions of the substrate, resulting in uniform etching or deposition of a uniform film.

In the etching process, it is important to control the depth of etching to have a desired value as well as to maintain the uniform depth of etching. It is thus desirable for the apparatus of the present invention to comprise a control means for controlling the depth of etching. This means will be described as follows.

To control the etching depth, the following operation has only to be performed. A monitor region is formed in a substrate to be treated, and the substrate is etched, as is the monitor using a diffraction grating mask. At the same time, monitor light is incident upon the monitor region, and the intensity thereof reflected by or transmitted through the region is measured. When the intensity reaches a desired value, the etching is stopped. The parameter of a diffraction grating varies with the etching depth, and the intensity of the monitor light reflected by or transmitted through the monitor region changes with the forming state of the diffraction grating. Therefore, the etching state can be judged by the intensity of the monitor light and the depth of etching can be controlled correctly.

Figure 8:
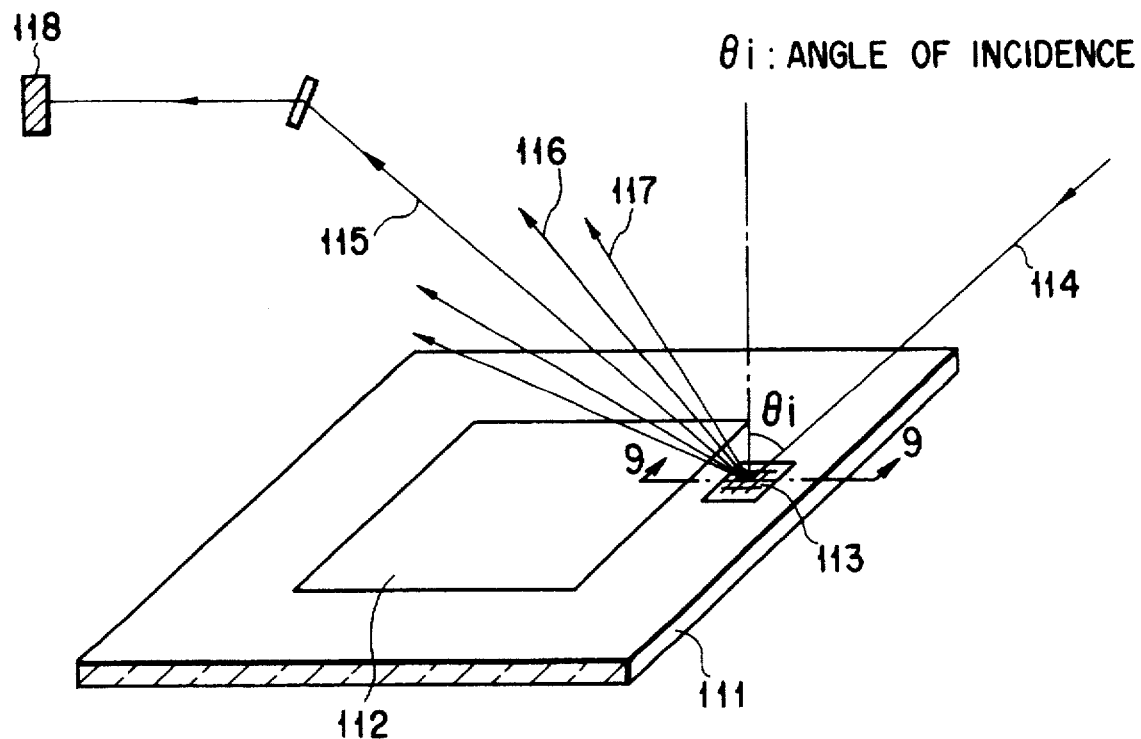
FIGS. 8 and 9 are a perspective view of an optical system and a cross-sectional view of a mask substrate, respectively, which show the principle of a method for monitoring an etching depth using light reflected by a diffraction grating pattern.

If the above monitoring technique is applied to the method of manufacturing a phase shifting mask, a phase shifter pattern is formed by etching on an exposure region 112 on a mask substrate 111 and simultaneously a diffraction grating pattern is formed by etching in a monitor region 113 outside the exposure region 112, as illustrated in FIG. 8. During the etching, the monitor region 113 is irradiated with monitor light 114 to judge the etching state. The monitor light 114 is reflected by the monitor region 113 at a total reflection angle and its intensity is measured. The total reflection angle θd is obtained by the following formulae:

$$\sin \theta d > n_1/n_0$$

$$\sin \theta d > n_2/n_0$$

Where $n_0$ is a refractive index of a medium 130 (e.g., air) above a diffraction grating, $n_1$ is that of a medium 131 (e.g., quartz) constituting the diffraction grating, and $n_2$ is that of a medium 132 constituting the diffraction grating.

When monochromatic light is used as the monitor light 114, several-order diffracted light is emitted as reflected light. In FIG. 8, reference numeral 115 shows zero-order reflected light, 116 indicates first-order reflected light, and 117 denotes second-order reflected light. The intensity of the diffracted light varies with the depth of etching. For example, the intensity of the zero-order reflected light 115 is measured by a light intensity measuring section 118 and varied as shown in FIG. 10.

Figure 9:
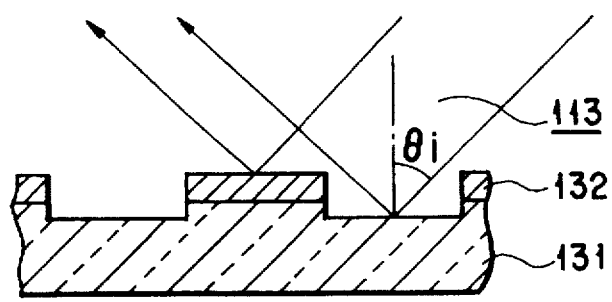

The intensity of the diffracted light varies for the following reason. As illustrated in FIG. 9, there occurs variations in etching and phase difference between the light reflected by the medium 131 and that reflected by the medium 132 and accordingly there occurs variations in interference between the reflected lights due to the phase difference. By monitoring the intensity of the several-order diffracted light concurrently with the etching thereof, the depth of etching can be obtained.

The measurement accuracy can be enhanced by monitoring the intensities of the diffracted lights of plural orders, or the intensities of the reflected lights using a plurality of incident lights each having a different wavelength.

When white light is used as the monitor light 114, the wavelength representing the maximum intensity of reflected light varies as the etching progresses as shown in FIG. 11. By monitoring the wavelength, the depth of etching can be obtained and the depth thereof can be controlled to have a predetermined value.

When the monitor light is not incident at the total reflection angle, a large part of the light transmits through an opening portion of the mask; therefore, it is likely that a sufficient amount of light to measure the intensity thereof will not be obtained or the light will be reflected diffusely on the surface of a holder under the mask to deteriorate the measurement precision. The same disadvantage is true of the case where there is a difference in reflectivity between the mediums constituting a diffraction grating. It is thus desirable to make the monitor light incident at the total reflection angle.

The monitor light can be, as shown in FIG. 12, transmitted through the substrate perpendicularly thereto. More specifically, monitor light 134 is incident upon a diffraction grating region (monitor region) 133 other than an exposure region 132 on a mask substrate 131, and the intensity of the monitor light transmitted concurrently with the etching. In FIG. 12, reference numeral 135 indicates zero-order transmitted light, 136 shows first-order transmitted light, 137 represents second-order transmitted light. For example, the intensity of the zero-order transmitted light 135 is measured by a light intensity measuring section 138.

In this case, as shown in FIG. 13, the intensity of transmitted light varies due to variations in phase between the light transmitted through a portion of medium 331 whose etching is in progress and the other portion thereof which is protected from etching by the use of an etching mask 332. In other words, as in the case shown in FIG. 10, the transmitted light intensity varies with the depth of etching.

If, therefore, the etching is completed when the etching depth reaches a desired value, the amount of variation in phase of a shifter within the exposure region can be controlled to have a desired value.

An example of the above monitoring technique applied to a method of manufacturing an i-line exposing mask, will now be described with reference to FIGS. 14A to 14D.

Figure 14A:
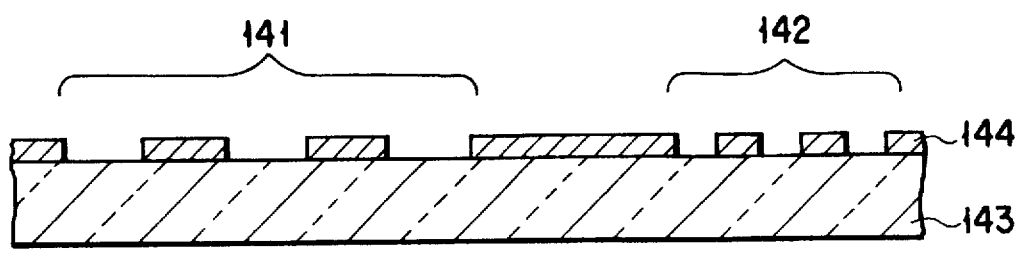
FIGS. 14A to 14D are cross-sectional views of a mask substrate in steps of manufacturing a phase shifting mask having a monitoring diffraction grating pattern.

As illustrated in FIG. 14A pattern of an opaque film 144 made of, e.g., chromium is formed on a transparent substrate 143 constituted of synthetic quartz. A monitor region 142 is formed on the remaining region of an exposure region 141 transferred onto a wafer by an exposure system, and a diffraction grating mask, e.g., a line/space pattern forming opaque and opening portions is formed in the monitor region.

Figure 14B:
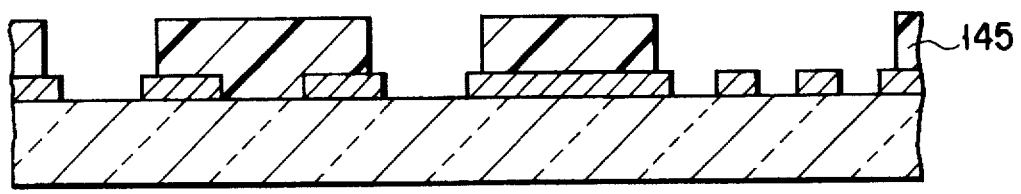
Figure 14C:
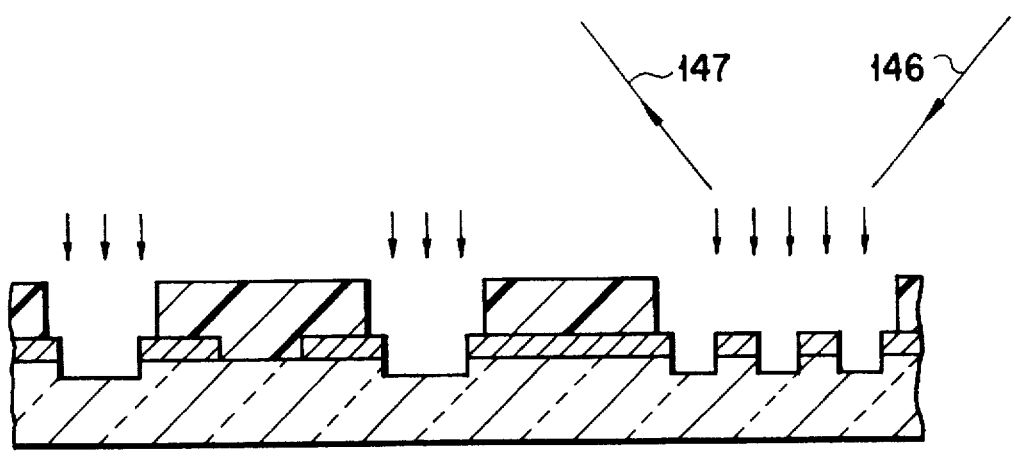
Figure 14D:
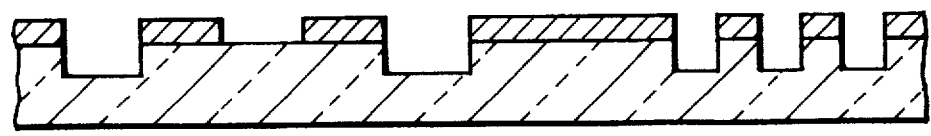

As shown in FIG. 14B, after a resist film 145 is formed on a substrate, it is patterned by, e.g., an electron beam lithography apparatus and then developed to expose the surface of the substrate corresponding to an opening of a shifter forming section. A monitor region 142 formed in the remaining region of the exposure region 141 is also exposed.

Figure 15:
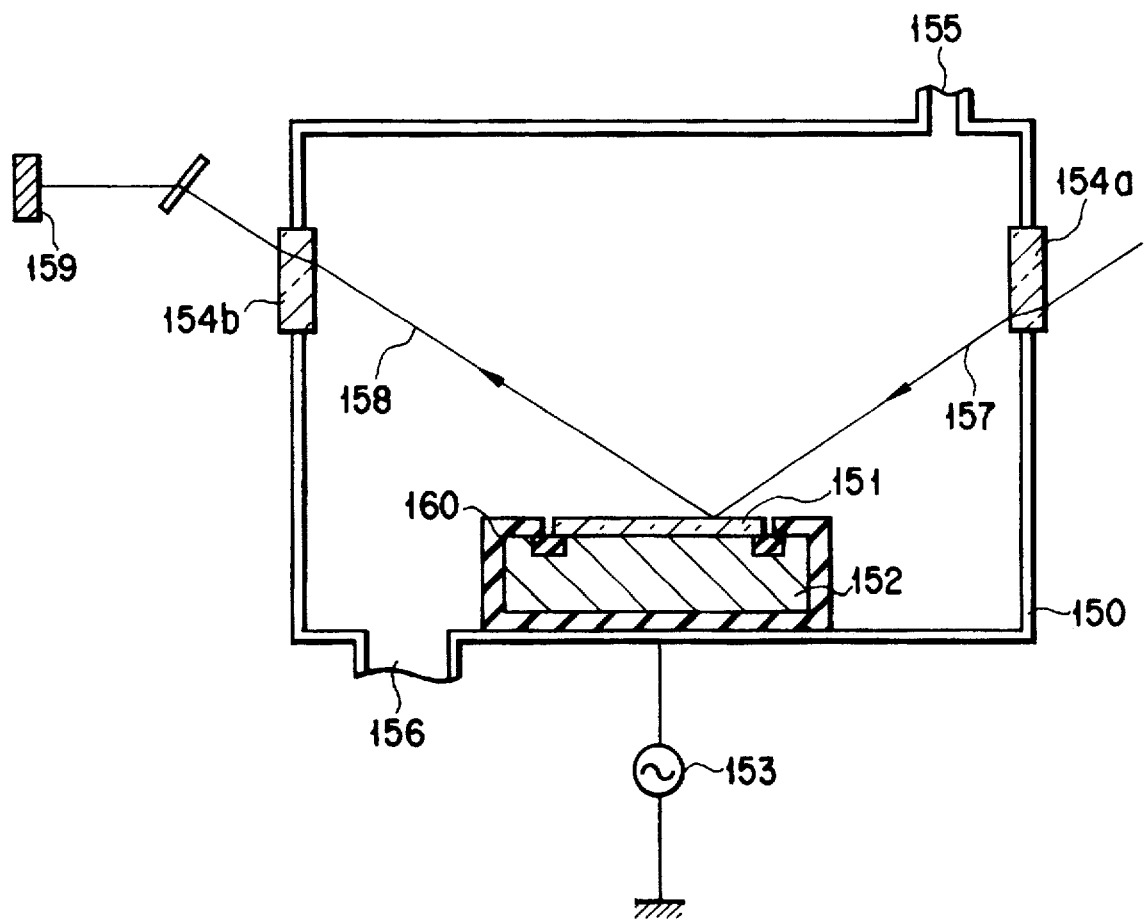
FIG. 15 is a cross-sectional view showing an example of a plasma etching apparatus including a monitoring optical system.

Then, the substrate is set into a chamber of a plasma etching apparatus shown in FIG. 15, and the substrate surface corresponding to the shifter forming section is etched by RIE sing a mixture of $CF_4$ and $H_2$. Thus the surface portions of the substrate, which are exposed to both the exposure and monitor regions 141 and 142, are etched at the same time.

The plasma etching apparatus is constructed as follows. A lower electrode 152 mounted with a mask substrate 151 is provided in a chamber 150. The electrode 152 includes a convex substrate mounting region and is surrounded with an insulative cover 160. A high-frequency power supply 153 is connected to the lower electrode 152, and the chamber 150 is grounded. The upper portion of the chamber 150 serves as an upper electrode. This apparatus is therefore a parallel plate type etching apparatus. Gas is introduced into the chamber 150 through an inlet 155, and gas of the chamber 150 is exhausted through an outlet 156.

The right and left side walls of the chamber 150 are provided with quartz windows 154a and 154b, respectively. Monochromatic monitor light 157 is incident upon the monitor region of the mask substrate through the quartz window 154a and its reflected monitor light 158 is transmitted to a reflected light measuring section 159 through the quartz window 154b. The intensity of the light 158 is measured by the measuring section 159 (e.g. photomultiplier).

In the etching process using the above-described plasma etching apparatus, the diffraction grating region is irradiated with light having a wavelength of 436 nm at an angle θi of 45°, and the intensity of the zero-order reflected light is measured, thereby monitoring the depth of etching.

The intensity of the monitor light varies with the etching depth, as shown in FIG. 10. If, therefore, a monitor mechanism, a measurement mechanism for measuring the intensity of reflected light, and a program and a mechanism for converting a measured value into an etching depth based on preset data of light intensity and etching depth, the etching depth can be known simultaneously with the light intensity.

When an i-line (wavelength: 365 nm) exposing phase shifting mask is manufactured, the etching depth corresponding to phase difference 180° is adjusted to 385 nm. Thus, the etching has only to be completed when the intensity of reflected light corresponding to the etching depth of 385 nm is obtained.

If light is incident upon both the surface of a quartz substrate and the chromium surface of an opaque film at an angle of 45°, it is totally reflected. If light is incident at such an angle as to prevent total reflection, a large part of the light is transmitted through the surface of the quartz substrate and its reflected light is decreased in intensity, with the result that the depth of etching cannot be monitored exactly.

White light mixed with various lights having different wavelengths, as well as monochromatic light, can be used for the light incident upon the diffraction grating region. The intensity of the reflected light depends on the wavelength, and the relationship between the wavelength and intensity of the reflected light varies with the etching in progress. This is shown in FIG. 11.

If, therefore, the wavelength of reflected light having the maximum intensity is monitored, the etching depth can be known and thus adjusted to a desired value.

According to the manufacturing process of the present invention, the diffraction grating is a line/space pattern of chromium opaque and quartz transmitting sections. However,be m etching depth can be monitored even in a line/space pattern of resist and quartz transmitting sections and, in this case, it is necessary to control the angle of incident light such that the light is totally reflected by both surfaces of resist and quartz.

In the above example, the monitor light is defined as reflected light. However, it is needless to say that it can be defined as transmitted light and, in this case, an optical probe is included in a holding member of the substrate of the etching apparatus, and the intensity of light passing through the probe is measured by a light-receiving section. The etching depth and light intensity can be known at the same time on the basis of the relationship between them. If, therefore, the etching is finished when the light intensity corresponding to a desired etching depth is obtained, the thickness of a shifter within an exposure region can be controlled to have a desired value.

In the above example, the monitor region is formed outside the exposure region. However, it can be done in a certain position within the exposure region unless the position contributes to pattern forming. This method is not limited to manufacturing of a phase shifting mask, but can be applied to various types of manufacturing processes for etching a substrate to a desired depth with good controllability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma processing method comprising the steps of:
   preparing a plasma processing apparatus comprising a first electrode which is substantially flat and has a substrate mounting region mounted with a specified substrate to be treated, said substrate mounting region being made in an island region surrounded by a groove portion, an outside shape of said island region being smaller than that of said specified substrate, and said groove portion extending under an insulative cover, which is provided on said first electrode apart from and surrounding said substrate mounting region, and being filled with an insulator such that a surface of said insulator is equal to or lower than that of said substrate mounting region, a chamber for containing said first electrode, gas introducing means for introducing a reactive gas into said chamber, gas exhausting means for exhausting said gas from said chamber, a second electrode provided inside said chamber, power supply means for supplying high-frequency power between said first electrode and said second electrode and said insulative cover whose inner periphery surrounds said substrate, for covering a surface of said first electrode other than said substrate mounting region;

mounting said specified substrate on said substrate mounting region of said first electrode in such a manner that said specified substrate completely covers said substrate mounting region;

introducing said gas into said chamber; and supplying said high-frequency power between said first electrode and said second electrode.

2. The plasma processing method according to claim 1, wherein said step of preparing a plasma processing apparatus includes a step of making a surface of said insulative cover to be substantially flush with that of said specified substrate, when said specified substrate is mounted on said substrate mounting region.

3. The plasma processing method according to claim 1, wherein an impedance of said insulative cover to a high frequency of said high-frequency power is substantially equal to an impedance of said specified substrate to the high frequency.

4. The plasma processing method according to claim 1, wherein said gas introduced into said chamber is a gas for etching said specified substrate.

5. A plasma processing method comprising the steps of:

preparing a plasma processing apparatus comprising a first electrode which is substantially flat and has a substrate mounting region mounted with a specified substrate to be treated, said substrate mounting region being formed as a concave portion which is larger than an outside shape of said specified substrate, a chamber for containing said first electrode, gas introducing means for introducing a reactive gas into said chamber, gas exhausting means for exhausting said reactive gas from said chamber, a second electrode provided in said chamber, power supply means for supplying high-frequency power between said first electrode and said second electrode and an insulative cover for covering at least a surface of said first electrode other than said substrate mounting region, said cover having hook portions to fix said specified substrate to said substrate mounting region and being formed with a thickness such that an electric field over said specified substrate is substantially uniform, mounting said specified substrate on said substrate mounting region of said first electrode and then fixing said substrate to said first electrode with said hook of said insulative cover;

introducing said reactive gas into said chamber; and supplying said high-frequency power between said first electrode and said second electrode.

6. A plasma processing apparatus comprising:

a first electrode which is substantially flat and has a substrate mounting region mounted with a specified substrate to be treated;

a chamber for containing said first electrode;

gas introducing means for introducing a reactive gas into said chamber;

gas exhausting means for exhausting said reactive gas from said chamber;

a second electrode constituted of one of a metal portion of said chamber and a metal plate provided inside said chamber;

power supply means for supplying high-frequency power between said first electrode and said second electrode; and an insulative cover whose inner periphery surrounds said substrate, for covering a surface of said first electrode other than said substrate mounting region, wherein said substrate mounting region is an island region surrounded by a groove portion and an outside shape of said island region is smaller than that of said specified substrate, said groove portion extends under said insulative cover and is filled with an insulator such that a surface of said insulator is equal to or lower than that of said substrate mounting region, in order that said specified substrate is mounted on said substrate mounting region so as to completely cover said substrate mounting region.

7. The plasma processing apparatus according to claim 6, wherein said groove portion is formed such that an outer periphery thereof is located 2 mm or more outward from an inner periphery of said insulative cover.

8. A plasma processing apparatus comprising:

a first electrode which is substantially flat and has a substrate mounting region mounted with a specified substrate to be treated;

a chamber for containing said first electrode;

gas introducing means for introducing a reactive gas into said chamber;

gas exhausting means for exhausting said gas from said chamber;

a second electrode constituted of one of a metal portion of said chamber and a metal plate provided inside said chamber;

power supply means for supplying high-frequency power between said first electrode and said second electrode; and an insulative cover for covering at least a surface of said first electrode other than said substrate mounting region, said cover having hook portions to fix said specified substrate to said substrate mounting region, wherein said substrate mounting region is formed as a concave portion which is larger than an outside shape of said specified substrate, and wherein said insulative cover is formed with a thickness such that an electric field over said specified substrate is substantially uniform.

* * * * *